United States Patent
Chou et al.

(10) Patent No.: US 10,115,784 B2
(45) Date of Patent: Oct. 30, 2018

(54) SEMICONDUCTOR DEVICE, MIM CAPACITOR AND ASSOCIATED FABRICATING METHOD

(71) Applicant: TAIWAN SEMICONDUCTOR MANUFACTURING COMPANY LTD., Hsinchu (TW)

(72) Inventors: Chung-Yen Chou, Hsinchu (TW); Shih-Chang Liu, Kaohsiung County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 145 days.

(21) Appl. No.: 15/072,951

(22) Filed: Mar. 17, 2016

(65) Prior Publication Data
US 2017/0271434 A1    Sep. 21, 2017

(51) Int. Cl.
*H01L 49/02*     (2006.01)
*H01L 21/768*    (2006.01)
*H01L 23/535*    (2006.01)

(52) U.S. Cl.
CPC ........ *H01L 28/60* (2013.01); *H01L 21/76895* (2013.01); *H01L 23/535* (2013.01)

(58) Field of Classification Search
CPC ........... H01L 23/5226; H01L 23/53295; H01L 21/76807; H01L 21/76808; H01L 28/90–28/92; H01L 29/66181; H01L 29/945
See application file for complete search history.

(56) References Cited

U.S. PATENT DOCUMENTS

| | | | |
|---|---|---|---|
| 8,980,723 B2* | 3/2015 | Liu | H01L 23/481 257/532 |
| 9,324,780 B2* | 4/2016 | Jen | H01L 28/60 |
| 2012/0080771 A1* | 4/2012 | Yang | H01L 23/5223 257/532 |
| 2015/0102461 A1* | 4/2015 | Lee | H01L 27/10814 257/532 |

* cited by examiner

*Primary Examiner* — Andrew Q Tran
(74) *Attorney, Agent, or Firm* — WPAT, P.C., Intellectual Property Attorneys; Anthony King

(57) ABSTRACT

The present disclosure provides a semiconductor device. The semiconductor device includes: a semiconductor substrate; a first dielectric layer over the semiconductor substrate; a second dielectric layer over the first dielectric layer; an via extending through the second dielectric layer; a bottom conductive layer conformably formed at a bottom and along side walls of the via; a third dielectric layer conformably formed over the bottom conductive layer; an upper conductive layer conformably formed over the third dielectric layer; and an upper contact formed over and coupled to the upper conductive layer and filling the via; wherein the upper conductive layer provide a diffusion barrier between the upper contact and the third dielectric layer. A metal-insulator-metal (MIM) capacitor and an associated manufacturing method are also disclosed.

13 Claims, 9 Drawing Sheets

SEMICONDUCTOR DEVICE, MIM CAPACITOR AND ASSOCIATED FABRICATING METHOD

BACKGROUND

Complementary metal-oxide-semiconductor (CMOS) is a technology for constructing digital integrated circuits (IC) such as microprocessors, microcontrollers, and others, or analog circuits such as image sensors, data converters, and transceivers for many types of communication. An IC may comprise digital logic parts such as transistors, plus other components such as resistors and capacitors, connected together by metal layers.

Many kinds of capacitors such as metal-oxide-semiconductor (MOS) capacitors, PN junction capacitors, polysilicon-insulator-polysilicon (PIP) capacitors, and metal-insulator-metal (MIM) capacitors are used in semiconductor devices. In particular, the MIM capacitor offers reduced electrode resistance with wide ranges of applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
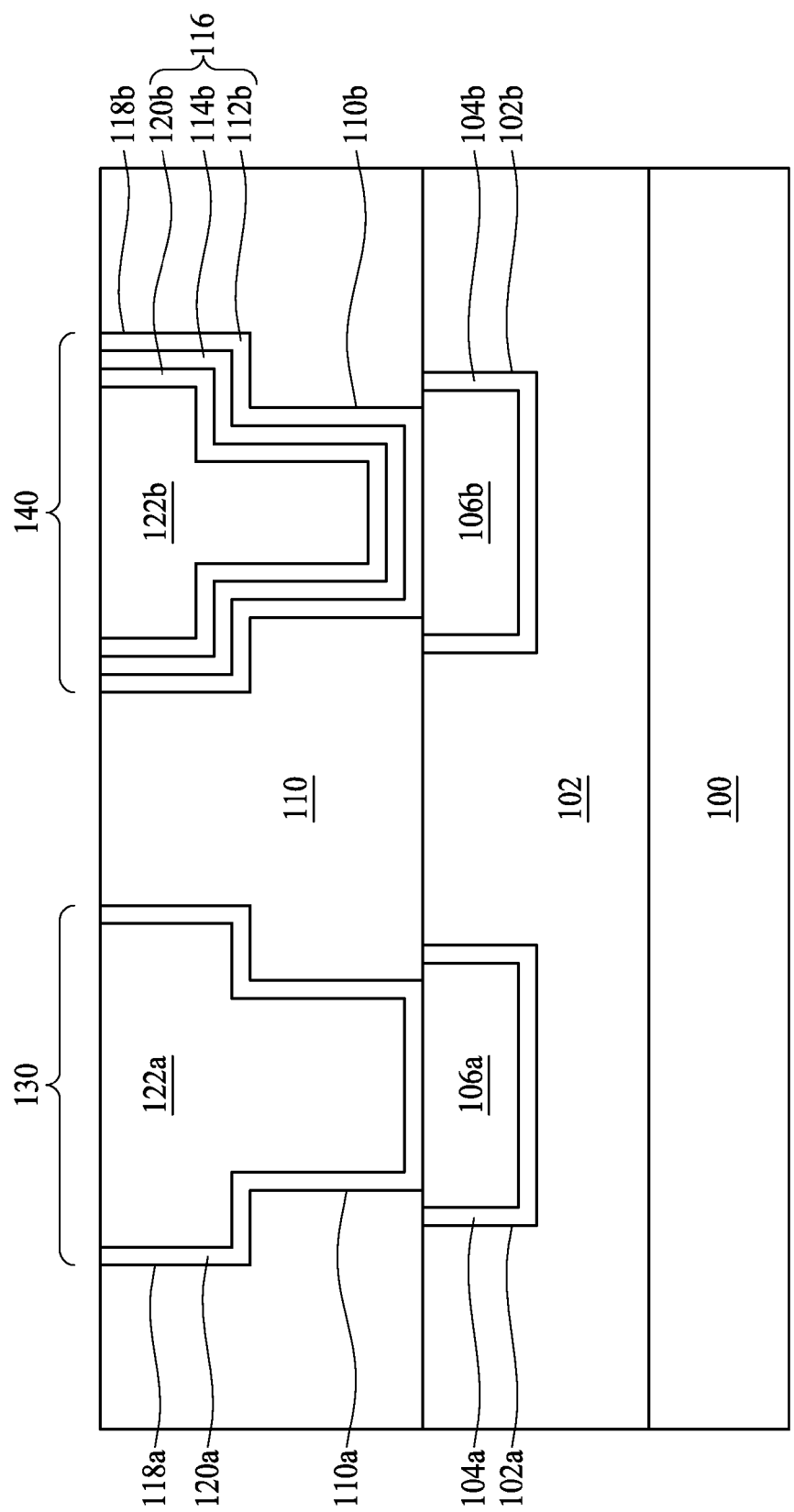
FIG. 1 illustrates a cross-sectional view of a semiconductor device according to an exemplary embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A semiconductor chip may be comprised of a plurality of contacts interconnected by multiple metal layers, which are separated by layers of insulating materials forming inter-metal dielectric (IMD) layers. Interconnections between different metal layers are made by vias, which go through insulating layers. Vias allow for communication between interconnects of other metal layers or directly with the semiconductor devices in the substrate. Typical chips may be comprised of three or more metal layers, followed by a final passivation layer. The final passivation layer may be used for protecting the CMOS from mechanical abrasion during probe and packaging and to provide a barrier to contaminants. After the final passivation layer, the bond pads for input/output will be opened, followed by the normal post-fabrication process such as wafer probe, die separation, and packaging.

One way to fabricate layers of metal for a chip involves a damascene process. Damascene means formation of a patterned layer imbedded on and in another layer such that the top surfaces of the two layers are coplanar. An IMD is deposited either directly on a substrate, or on top of another existing layer of metal. Once the IMD is deposited, portions of the IMD may be etched away to form recessed features, such as trenches and vias, which can connect different regions of the chip and accommodate the conductive lines. A damascene process which creates either only trenches or vias is known as a single damascene process. A damascene process which creates both trenches and vias at once is known as a dual damascene process.

Damascene and dual damascene processes use lower resistance metals (e.g. copper) to form many metal elements (e.g. lines, interconnects, and the like) instead of the conventionally used aluminum. A thin barrier film is used to prevent copper diffusion into the dielectric. As the number of interconnect levels increases, planarization of the previous layers is required to ensure a flat surface prior to subsequent lithography. Chemical mechanical planarization (CMP) is the primary processing method to achieve such planarization although dry etch back is still used sometimes. The present disclosure provides a Metal-insulator-metal (MIM) capacitors integrated in a damascene or dual damascene process with a simple structure.

FIG. 1 illustrates a cross-sectional view of a semiconductor device according to an exemplary embodiment of the present disclosure.

Referring to FIG. 1, an interlayer dielectric (ELD) layer 102 is disposed on a semiconductor substrate 100. A plurality of drain and source regions of transistors may be formed on the semiconductor substrate 100. The semiconductor substrate 100 may include, for example, a bulk silicon, doped or undoped, or an active layer of a semiconductor-on-insulator (SOI) substrate. Generally, an SOI substrate includes a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

Transistors may include a gate structure, and the gate structure may be a planar or three dimension (such as FinFET) gate. Various materials can be chosen for the gate structure, such as metal, poly, or metal alloy. In some embodiments, the semiconductor substrate 100 may include p-type and/or n-type doped regions of electrical devices such as N-type metal-oxide semiconductor (NMOS) devices and/or P-type metal-oxide semiconductor (PHOS) devices. The N/P-type devices may include transistors, capacitors, resistors, diodes, photo-diodes, fuses, and the interconnected to perform one or more functions. The functions may include memory structures, processing structures, sensors, amplifiers, power distribution, input/output circuitry, or the like.

The ILD layer 102, i.e., an inter-layer dielectric (ILD) layer, is formed on the semiconductor substrate 100 herein as mentioned above. The LLD layer 102 may include a low dielectric constant (k value less than about 3.0) material or an extra low dielectric constant (k value less than about 2.5) material. For example, the ILD layer 102 may include an oxide, SiO2, borophosphosilicate glass (BPSG), TEOS, spin-on glass (SOG), undoped silicate glass (USG), fluorinated silicate glass (FSG), high-density plasma (HDP) oxide, or plasma-enhanced TEOS (PETEOS).

An intermetal dielectric (IMD) layer 110 is formed on the ILD layer 102. The material of the IMD layer 110 may be substantially the same or similar to the ILD layer 102. In the exemplary embodiment, the IMD layer 110 may be formed of such as silicon oxide based doped or un-doped materials, but preferably undoped silicate glass (USG) for enhanced structural stability, or fluorinated silicate glass (FSG) for structural stability FIG. 1 illustrates a logical interconnecting architecture 130 at the left side and an MIM capacitor 140 at the right side. The logical interconnecting architecture 130 includes a lower metal interconnection 106a and an upper metal interconnection 122a. The MIM capacitor 140 includes a capacitance storage body 116 sandwiched between a bottom electrode pick-up 106b and an upper electrode pick-up 122b. The MIM capacitor 140 is formed within the IMD layer 110 between two interconnect metal layers.

A lower metal interconnection trench region 102a and a bottom electrode pick-up trench region 102b are disposed in the ILD layer 102 and are spaced apart from each other. A first diffusion barrier layer 104a is disposed in the lower metal interconnection trench region 102a to cover the lower metal interconnection trench region 102a and separate the lower metal interconnection 106a from being in contact with the ILD layer 102. A second diffusion barrier layer 104b is disposed in the bottom electrode pick-up trench region 102b to cover the bottom electrode pick-up trench region 102b and separate the bottom electrode pick-up 106b from being in contact with the ILD layer 102.

The IMD layer 110 covers the lower metal interconnection 106a, the bottom electrode pick-up 106b and the ILD layer 102. The IMD layer 110 includes a first via 110a and a first trench 118a crossing over the first via 110a. The first via 110a and the first trench 118a form a step configuration, i.e. a dual damascene structure penetrating through the IMD layer 110 at the left side where at least a portion of the logical interconnecting architecture 130 is contained. The IMD layer 110 further includes a second via 110b and a second trench 118b crossing over the second via 110b. The second via 110b and the second trench 118b form a dual damascene structure penetrating through the IMD layer 110 at the right side where at least a portion of the MIM capacitor 140, i.e. the capacitance storage body 116, is contained. In the exemplary embodiment, the first trench 118a and the second trench 118b possess a wider diameter than the first via 110a and the second via 110b.

For the logical interconnecting architecture 130, a third diffusion barrier layer 120a covers inner surfaces of the first via 110a and the first trench 118a. The upper metal interconnection 122a fills the first via 110a and the first trench 118, and the upper metal interconnection 122a is surrounded by the third diffusion barrier layer 120a. For the MIM capacitor 140, a bottom electrode layer 112b covers inner surfaces of the second via 110b and the second trench 118b. A capacitor dielectric layer 114b covers the bottom electrode layer 112b. A second metal layer 120b covers inner surfaces of the capacitor dielectric layer 114b. The upper electrode pick-up 122b fills the second via 110b and the second trench 118b and is surrounded by the second metal layer 120b. Capacitance storage capability of the capacitance storage body 116 may be determined in accordance with, for example, a dielectric constant, an area and a thickness of the capacitor dielectric layer 114b.

FIG. 1 is only for illustrative purposes and is not a limitation of the present disclosure. For example, there may be more than one MIM capacitor so formed by the illustrative process. The size and position of the lower metal interconnection 106a, the bottom electrode pick-up 106b, the upper metal interconnection 122a and the upper electrode pick-up 122b are for illustrative purposes and are not limiting. There may be more than one upper and lower metal interconnections in the logic part rather than one as shown. The size of each layer such as 100, 102 and 110 are only for illustrative purposes and is not limiting. The Capacitance storage body 116 may be of different shapes such as cylindrical shape, or a concave shape. A method of fabricating the semiconductor device of FIG. 1 will be described herein below with greater details.

Figure 2:
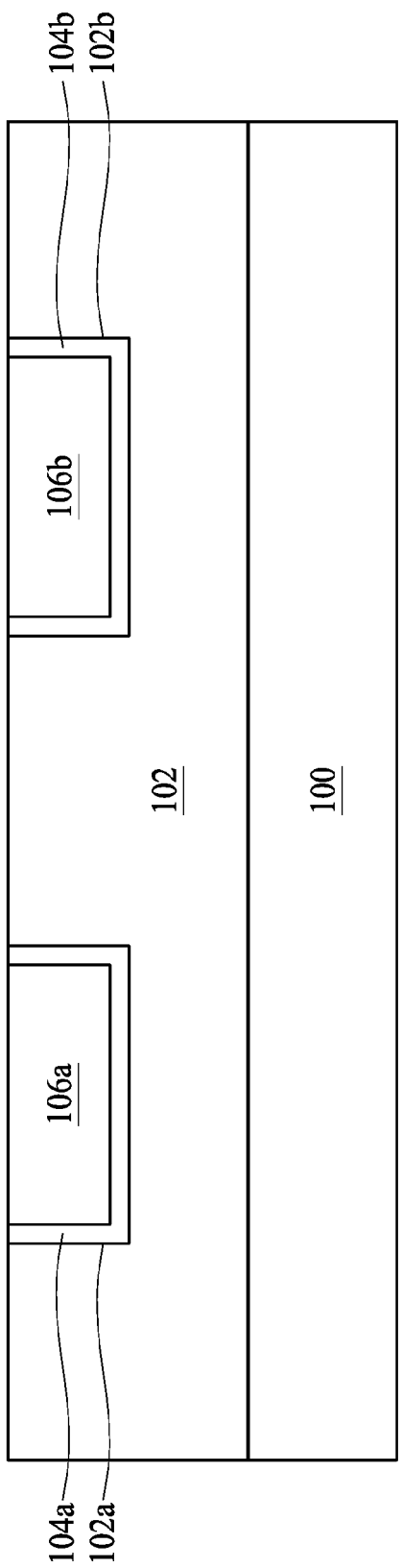
FIGS. 2 through 8 illustrate cross-sectional views of intermediate stages for fabricating a semiconductor device according to an exemplary embodiment of the present disclosure.

FIGS. 2 through 8 illustrate cross-sectional views of intermediate stages for fabricating a semiconductor device according to an exemplary embodiment of the present disclosure. Referring to FIG. 2, the ILD layer 102 is formed on the semiconductor substrate 100. The ILD layer 102 is patterned by photolithography and etching processes to form the lower metal interconnection trench region 102a and the bottom electrode pick-up trench region 102b. The lower metal interconnection 106a is then formed in the lower metal interconnection trench region 102a; and the bottom electrode pick-up 106b is then formed in the bottom electrode pick-up trench region 102b. A highly reliable metal layer, e.g., a copper layer, may be used as the lower metal interconnection trench region 102a and the bottom electrode pick-up trench region 102b.

The first diffusion barrier layer 104a and the second diffusion barrier layer 104b may be conformably formed on inner surfaces of the lower metal interconnection trench region 102a and the bottom electrode pick-up trench region 102b respectively before forming the lower metal interconnection 106a and the bottom electrode pick-up 106b. The first diffusion barrier layer 104a and the second diffusion barrier layer 104b may be formed of one selected from the group consisting of titanium (Ti) layer, a tantalum (Ta) layer, and a tungsten (W) layer. Alternatively, the first diffusion barrier layer 104a and the second diffusion barrier layer 104b may be formed of a nitride layer including one selected from the titanium (Ti) layer, the tantalum (Ta) layer, and the tungsten (W) layer, e.g., a titanium nitride (TiN) layer, a tantalum nitride (TaN) layer, or a tungsten nitride (WN) layer. As a further alternative, the first diffusion barrier layer 104a and the second diffusion barrier layer 104b may be formed of a three-member nitride layer containing titanium Ti), tantalum (Ta) or tungsten (W), e.g., a titanium silicon nitride (TiSiN) layer, a tantalum silicon nitride (TaSiN) layer, or a tungsten silicon nitride (WSiN) layer.

Figure 3:
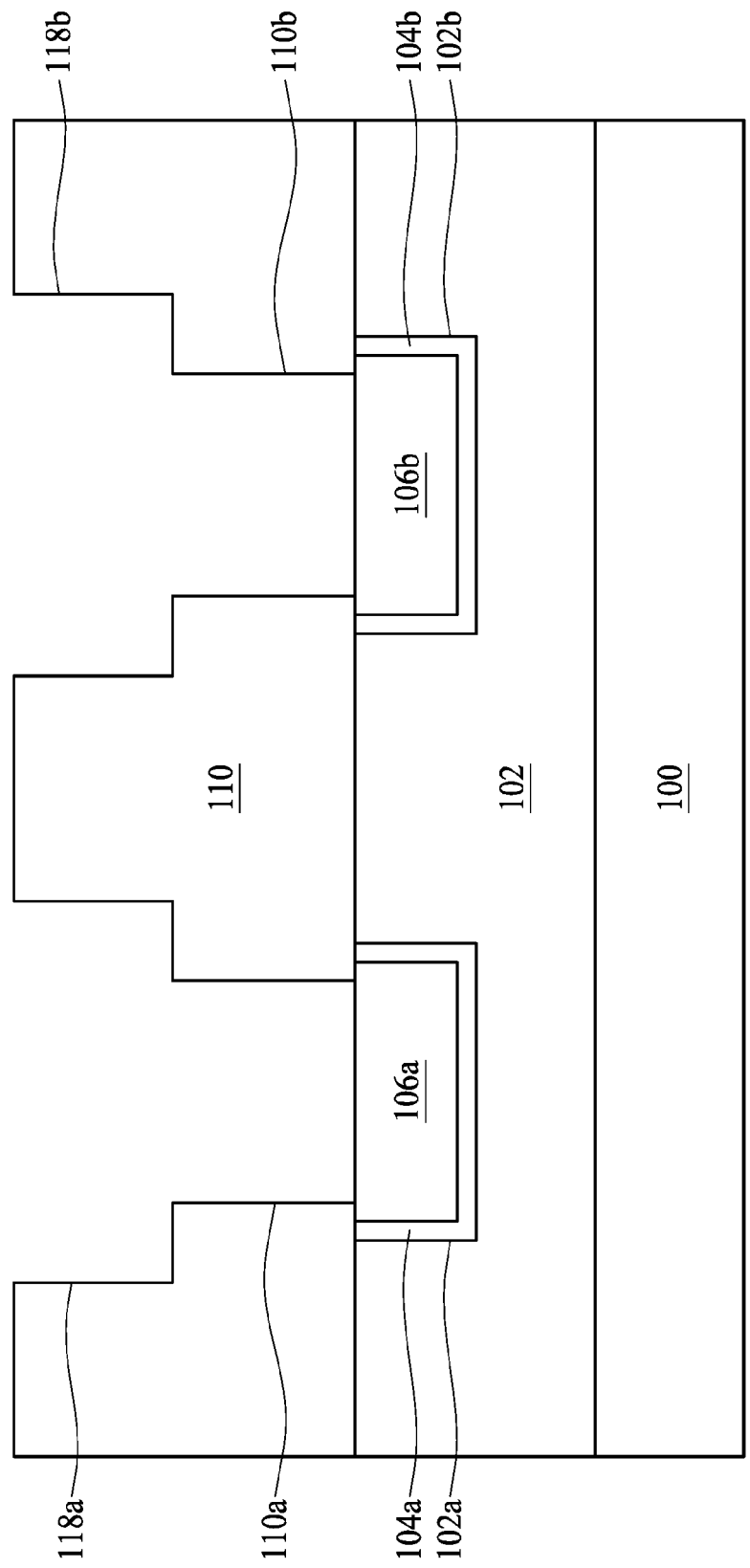

Referring to FIG. 3, the IMD layer 110 is formed on the semiconductor substrate 100 by depositing IMD materials such as USG oxide film. The IMD layer 110 may be deposited by methods including chemical vapor deposition (CVD), low pressure chemical CVD (LPCVD), plasma enhanced CVD (PECVD), high density plasma CVD (HDP-CVD) or physical vapor deposition (PVD) sputtering methods. Etch stop layers may be deposited between processes of forming the MID layer 110; however, details are omitted here for brevity. An advantageous feature of the present disclosure is that the IMD layer 110 is a standard layer that is typically employed in CMOS logic processes. Hence, advantageously, no additional IMD sub-layers or processes are required to integrate the illustrative process into standard CMOS process flows.

The IMD layer 110 is patterned by photolithography and etching processes to form dual damascene structures including the first via 110a, the first trench 118a, the second via 110b and the second trench 118b to expose the lower metal interconnection 106a and the bottom electrode pick-up 106b, respectively as shown in a cross-sectional view of FIG. 3. In particular, the first via 110a, the first trench 118a, the second via 110b and the second trench 118b are formed using part of a CMOS hack end of line (BEOL) process flow for other non-capacitor logic parts. Formation of the IMD layer 110 is known in the art. The first via 110a, the first trench 118a, the second via 110b and the second trench 118b may be shaped as a cup (i.e., the first via 110a, the first trench 118a, the second via 110b and the second trench 118b may have a substantially circular shape when seen from above). The number, the position, the size, the width, and the shape of the first via 110a, the first trench 118a, the second via 110b and the second trench 118b are only for illustrative purposes only, but are not limiting.

Figure 4:
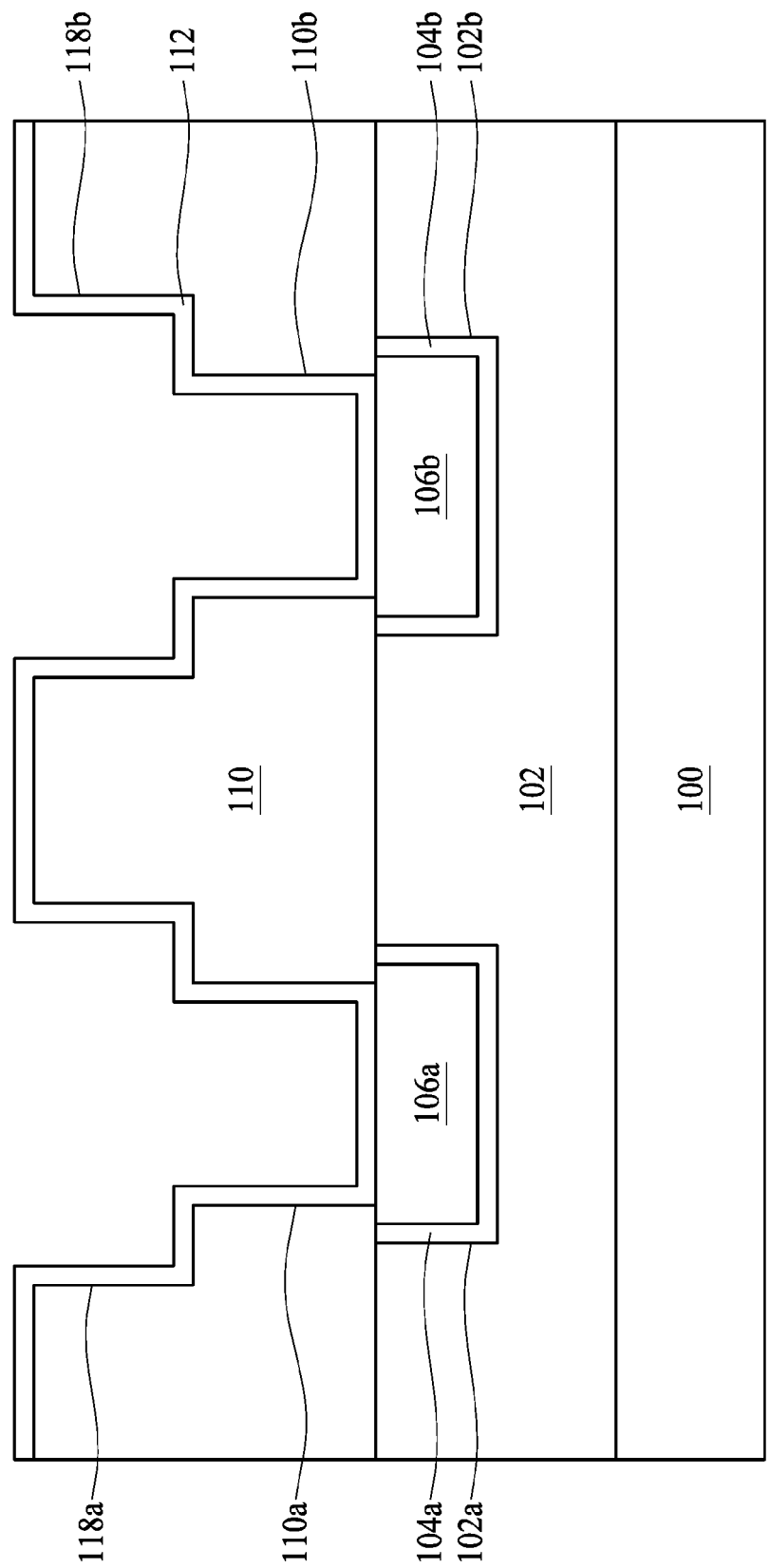

Referring to FIG. 4, a bottom electrode layer 112 is then conformably deposited at the bottom and along the side wall of the first via 110a, the first trench 118a, the second via 110b and the second trench 118b, and on top of the surface of the IMD layer 110. The bottom electrode layer 112 deposited at the bottom of the second via 110b is in contact with the bottom electrode pick-up 106b to form an electrical contact path. It is important that the bottom electrode layer 112 be selected from a group of materials compatible with copper, that is, materials that will form a barrier to diffusion of copper into the dielectric layers surrounding the dual damascene structure. In the exemplary embodiment, the bottom electrode layer 112 may be formed of conductive nitride materials such as tantalum nitride (TaN) for acting as a diffusion barrier layer and a bottom electrode of the capacitance storage body 116 at the same time.

In some embodiments, the bottom electrode layer 112 may be formed of a composite layer including an outer thin diffusion barrier layer for contacting the bottom electrode pick-up 106b and an inner conductive layer with a higher conductivity than the thin diffusion barrier layer for contacting the following deposited capacitor dielectric layer 114. In particular, it is preferable to form the composite layer including an outer thin TaN layer and an inner TiN layer. In this way, the composite layer can provide a higher barrier capability and a higher conductivity at the same time.

Figure 5:
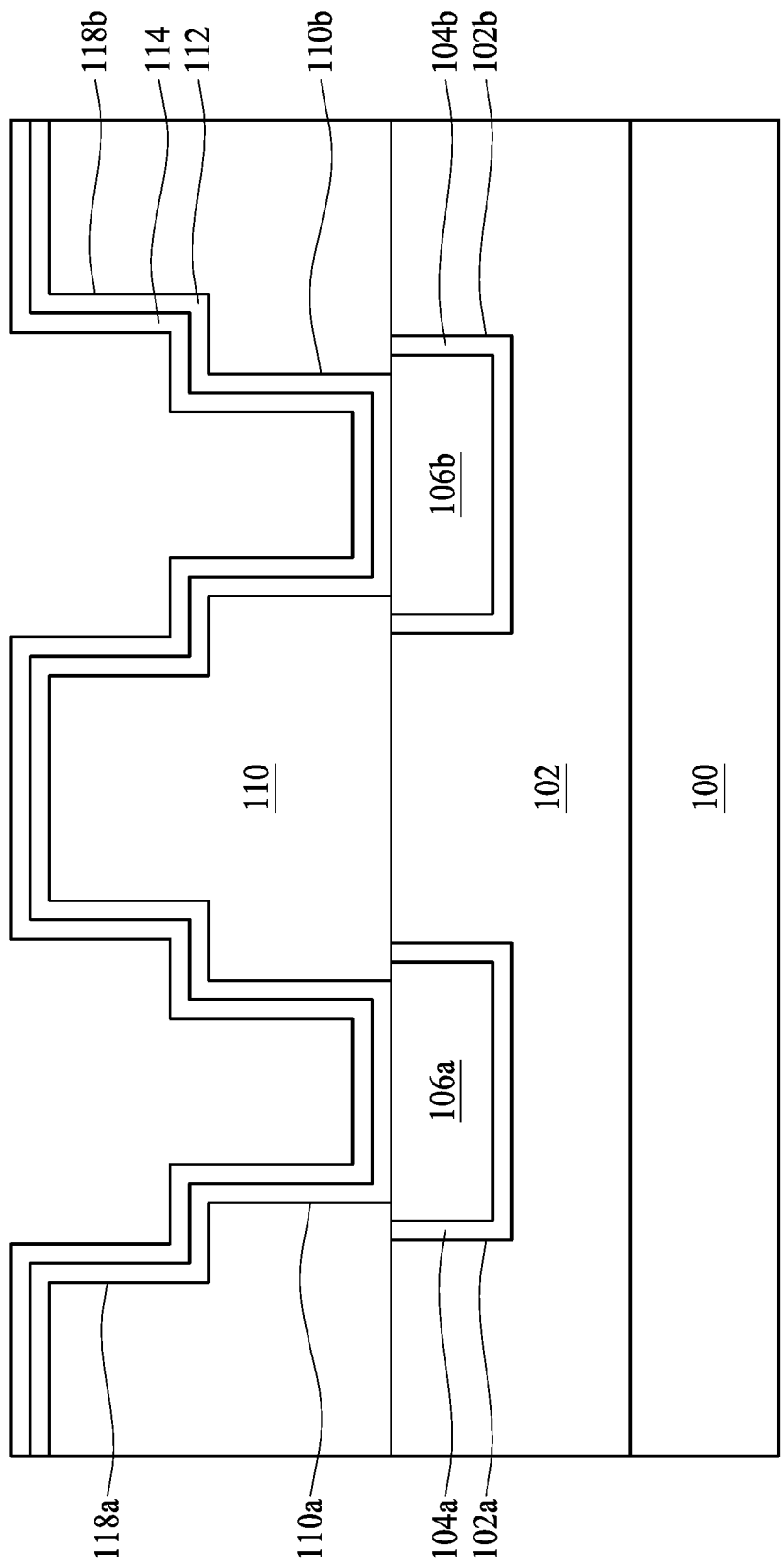

Referring to FIG. 5, a capacitor dielectric layer 114 may then be conformably deposited on the bottom electrode layer 112 at the bottom and along the side wall of the first via 110a, the first trench 118a, the second via 110b and the second trench 118b, and on top of the surface of the IMD layer 110by means including atomic layer deposition (ALD), PECVD, and atomic layer CVD (ALCVD). The material may include any capacitor dielectric such as $SiO_2$, metal nitrides, such as silicon nitride (e.g., $Si_3N_4$) or high dielectric constant (high-k) materials ranging from 20 to 500. such as $TiO_2$, $Ta_2O_5$, $ZrO_2$, including rare earth oxides such as $Y_2O_3$, $La_2O_5$, $HfO_2$, and their aluminates and silicates. It will be appreciated that the thickness of the capacitor dielectric layer 114 varies depending on the dielectric material and the desired capacitance.

Figure 6:
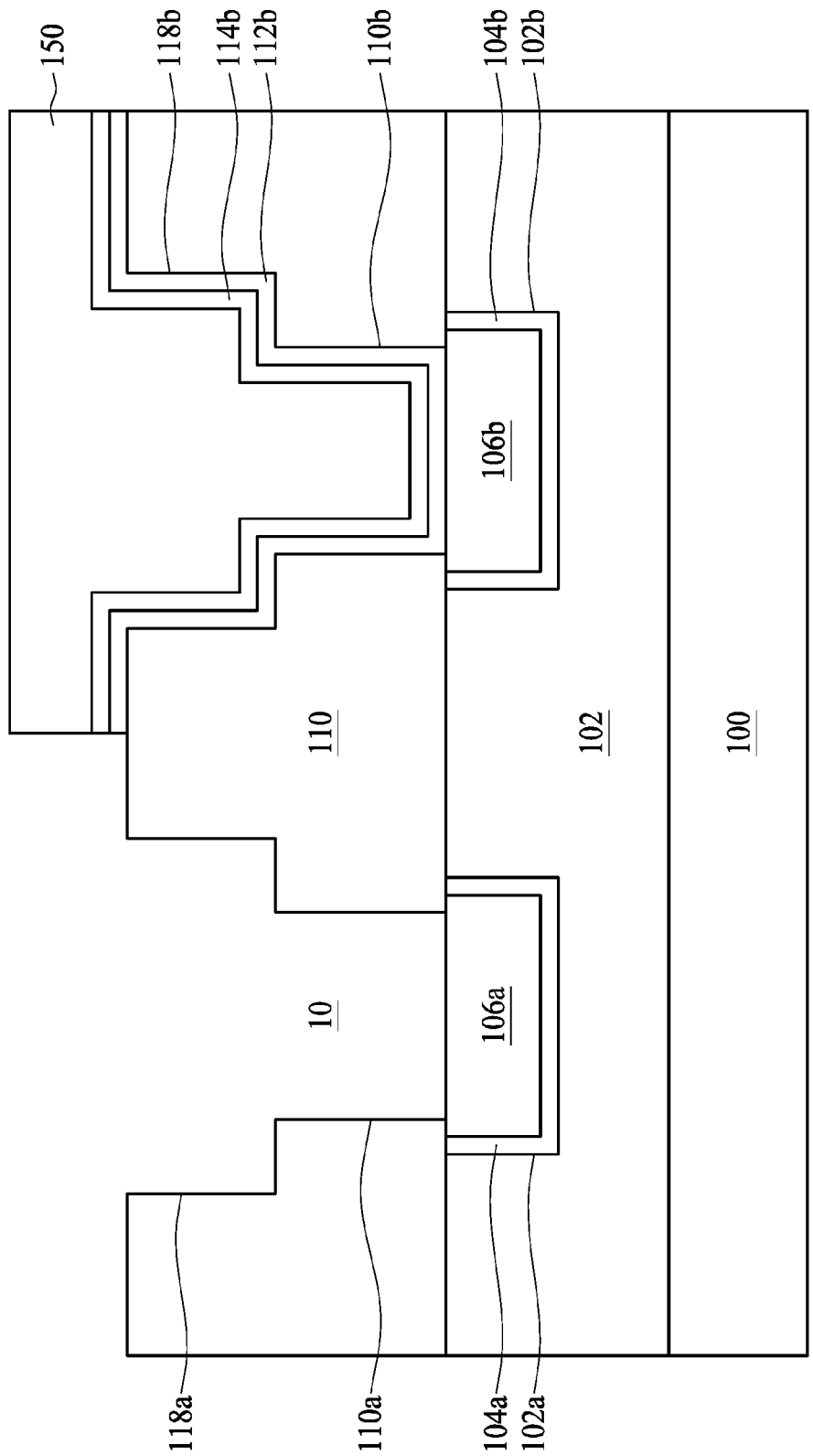

Referring to FIG. 6, the capacitor dielectric layer 114 and the bottom electrode layer 112 are removed from the non-capacitor logic area (i.e. the logical interconnecting architecture 130) using a patterned photoresist 150 to form the capacitor dielectric layer 114b and the bottom electrode layer 112b. The capacitor dielectric layer 114 and the bottom electrode layer 112 may be removed by using dry etch methods known in the art. Afterwards, the patterned photoresist 150 may be removed utilizing an asking process. In some embodiments, a nitrogen gas ($N_2$) may be introduced to generate nitrogen plasma to remove the patterned photoresist layer. In some embodiments, a hydrogen gas ($H_2$) may be additionally introduced to generate nitrogen-containing plasma to remove the patterned photoresist layer. The nitrogen gas and hydrogen gas ratio is properly tuned for effectively removing the patterned photoresist layer. In some embodiments, an argon gas (Ar) is additionally introduced to generate nitrogen-containing plasma to remove the patterned photoresist layer. The nitrogen gas, argon gas ratio is properly tuned for effectively removing the patterned photoresist layer. In some embodiments, nitrogen, hydrogen and argon are introduced to remove the patterned photoresist layer.

Figure 7:
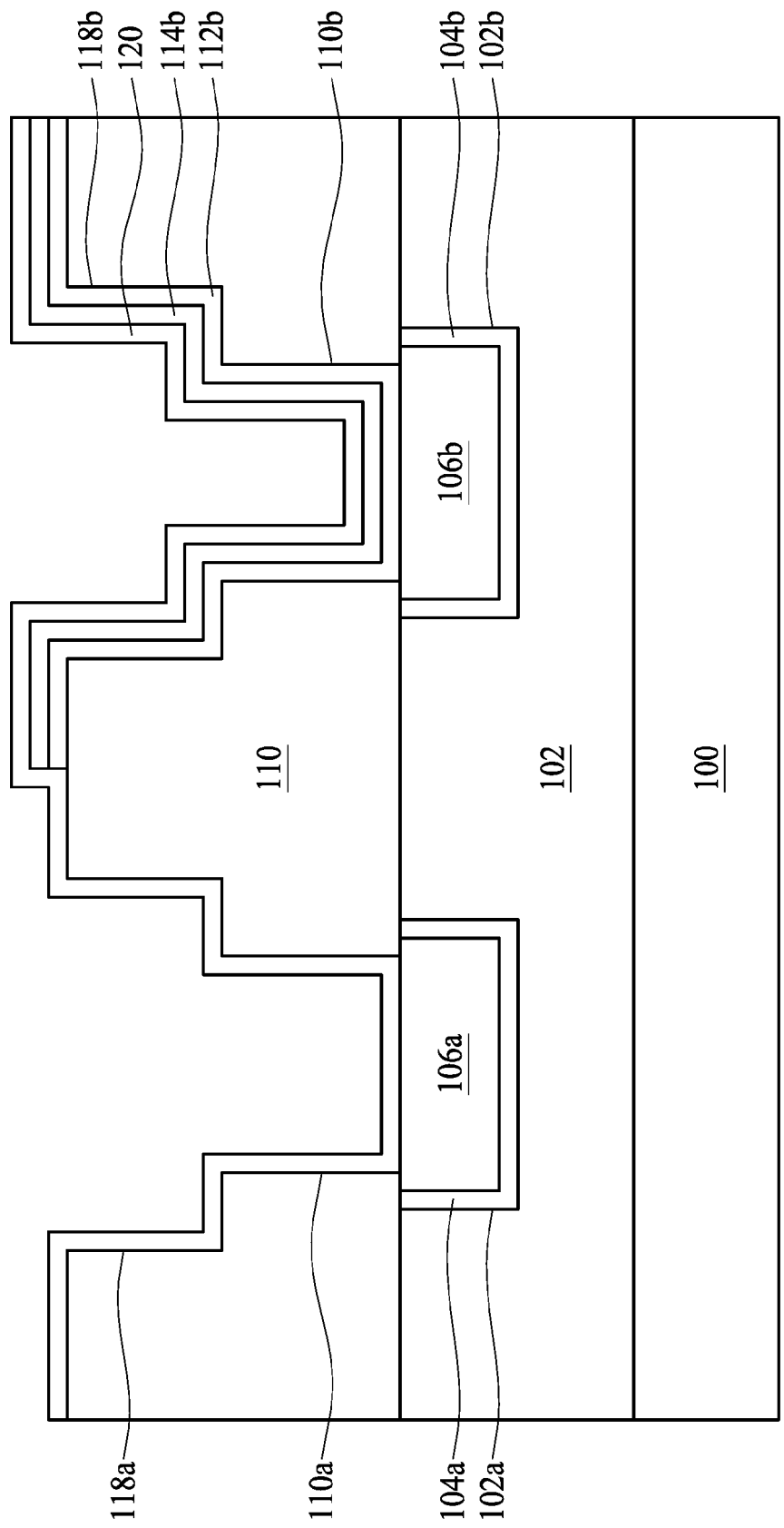

A layer of upper electrode layer 120 is then deposited over the capacitor dielectric layer 114b, as shown in FIG. 7, by sputter deposition techniques. The upper electrode layer 120b of the upper electrode layer 120 is further in contact with the upper electrode pick-up 122b to form an electrical contact path. The upper electrode layer 120 preferably includes at least one conductive layer, for example including the same preferred materials deposited in the bottom electrode layer 112b. It is important that the upper electrode layer 120 be selected from a group of materials compatible with copper, that is, materials that will form a barrier to diffusion of copper into the dielectric layers surrounding the dual damascene structure. In the exemplary embodiment, the upper electrode layer 120 may be formed of conductive nitride materials such as TaN for acting as a diffusion barrier layer and an upper electrode of the capacitance storage body 116 at the same time.

In some embodiments, the upper electrode layer 120 may be formed of a composite layer including an outer thin diffusion barrier layer for contacting the following deposited upper electrode pick-up 122b and an inner conductive layer with a higher conductivity than the thin diffusion barrier layer for contacting the capacitor dielectric layer 114b. In particular, it is preferable to form the composite layer including an outer thin TaN layer and an inner TiN layer. In this way, the composite layer can provide a higher barrier capability and a higher conductivity at the same time.

Figure 8:
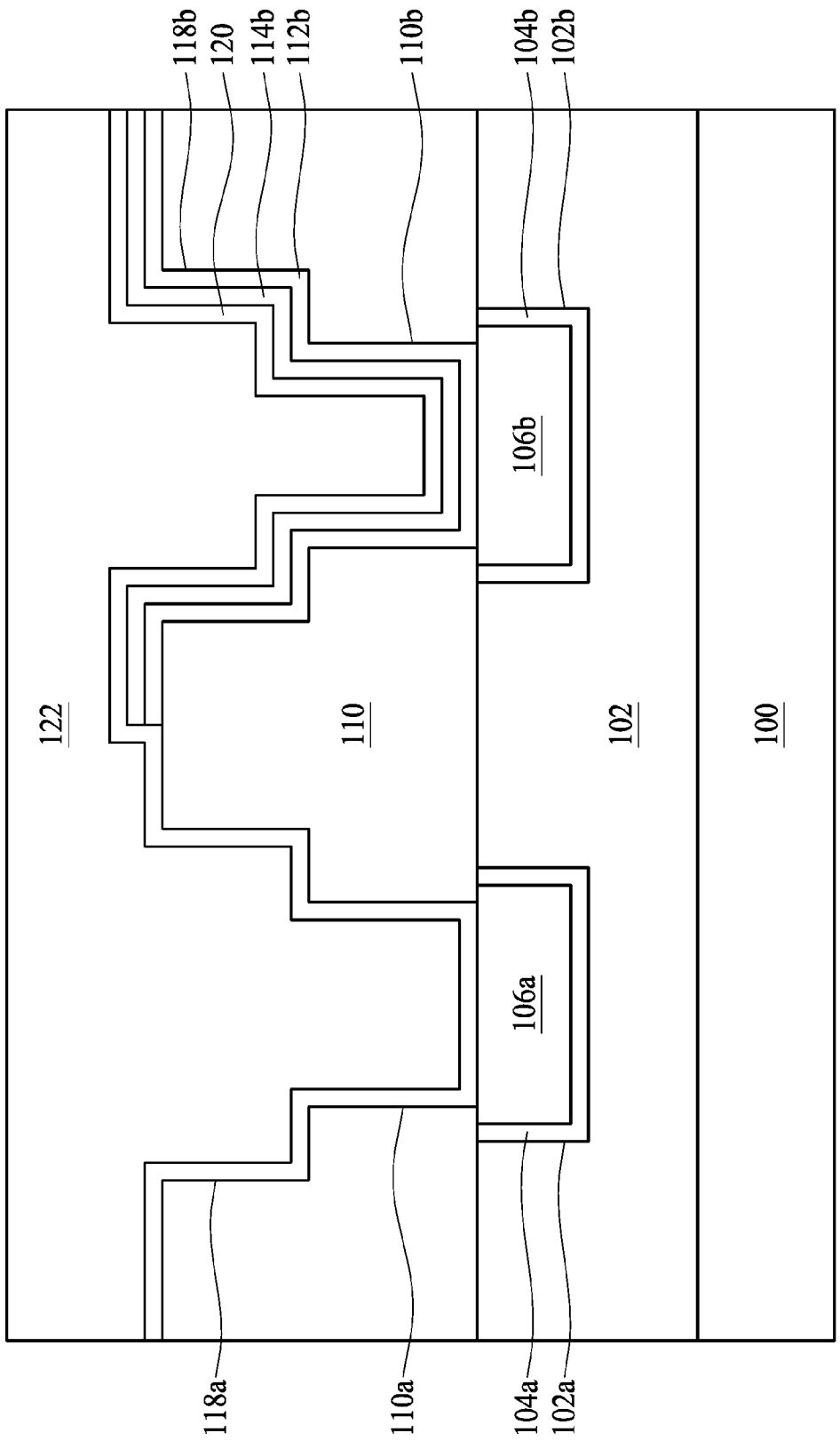

The overall thickness of the upper electrode layer 120 is preferably about the same thickness or preferably thinner than a thickness of the bottom electrode layer 112b, depending on the application. Additional metal filling material 122 is used to fill the remaining part of the first via 110a, the first trench 118a, the second via 110b, the second trench 118b and on top of the upper electrode layer 120, as shown in FIG. 8. The metal filling material 122 includes copper (Cu) in the exemplary embodiment. The metal filling material 122 may be formed by a CVD method, an electroplating method, or an electroless plating method.

In some embodiments, prior to the deposition of metal, the dual damascene structure may be lined with a seed layer (not shown). The seed layer provides nucleation sites for the metal that is to be deposited next into the dual damascene structure.

A portion of the so formed bottom electrode layer 112b, the capacitor dielectric layer 114b, the upper electrode layer 120, and the metal material 122 may be removed by a planarizing process such as a CMP process to form the bottom electrode layer 112b, the capacitor dielectric layer 114b, the upper electrode layer 120b and the upper electrode pick-up 122b for the MIM capacitor 140 as shown in FIG. 1.

The process for fabricating the MIM capacitor 140 may proceed further by forming metal contacts and vias in upper layers using the dual damascene Cu process. The metal contacts may be used as a top plate for the MIM capacitor 140 and for normal logic part of the logical interconnecting architecture 130. The vias may be used for interconnecting the MIM capacitor 140 and the logical interconnecting architecture 130 to the upper layer. The processes for forming via and metal openings, commonly referred to as damascene or dual damascene process, are well known to those skilled in the art and hence are not repeated herein.

Figure 9:
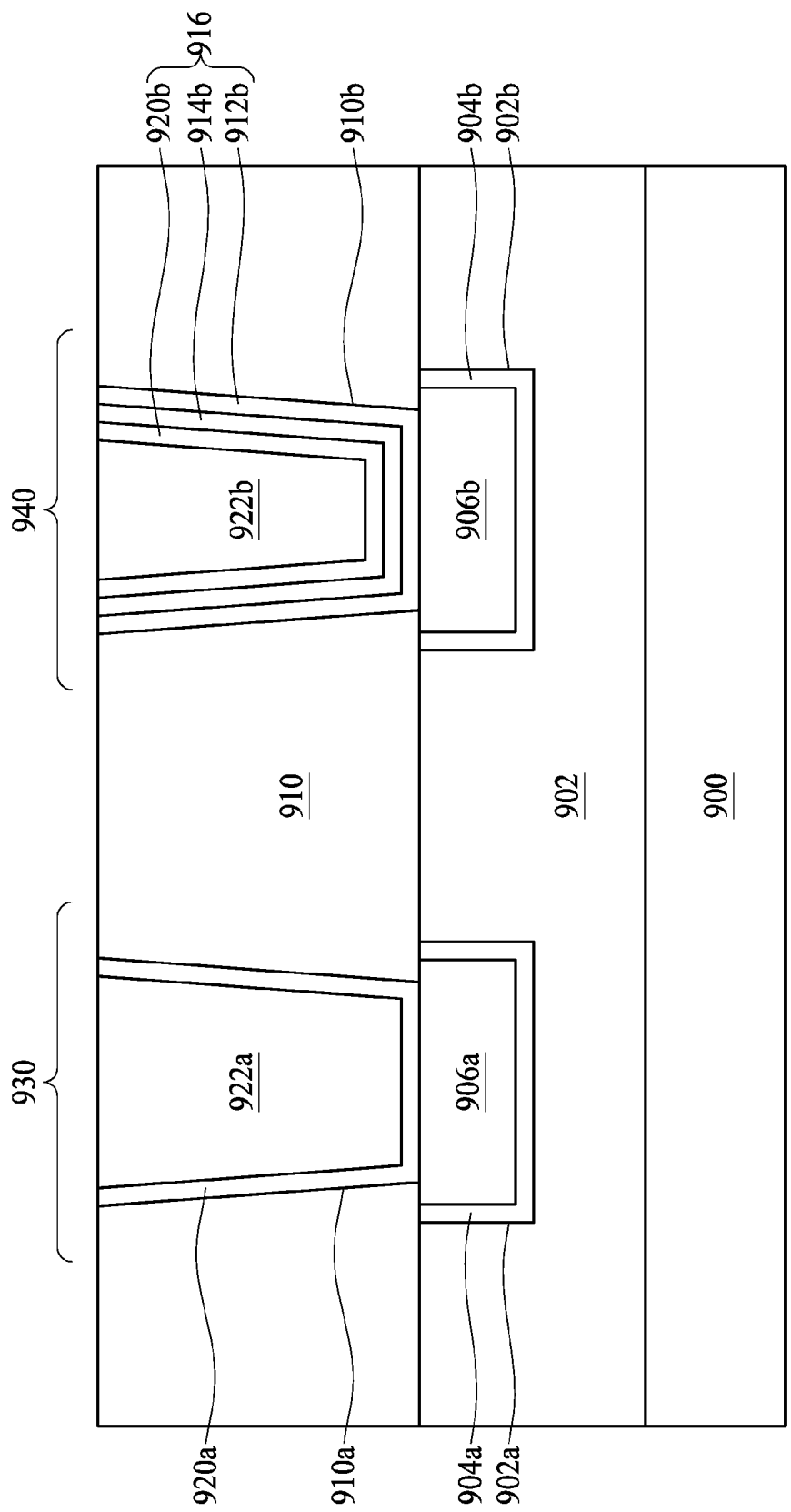
FIG. 9 illustrates a cross-sectional view of a semiconductor device according to another embodiment of the present disclosure.

FIG. 9 illustrates a cross-sectional view of a semiconductor device according to another exemplary embodiment of the present disclosure.

Referring to FIG. 9, an interlayer dielectric (ILD) layer 902 is disposed on a semiconductor substrate 900. A plurality of drain and source regions of transistors may be formed on the semiconductor substrate 900. An IMD layer 910 is formed on the ILD layer 902. The semiconductor substrate 900, the ILD layer 902 and the MID layer 910 may be the same or similar to the semiconductor substrate 100, the ILD layer 102 and the IMD layer 110 and details are omitted here for brevity.

FIG. 9 illustrates a logical interconnecting architecture 930 at the left side and an MIM capacitor 940 at the right side. The logical interconnecting architecture 930 includes a lower metal interconnection 906a and an upper metal interconnection 922a. The MIM capacitor 940 includes a capacitance storage body 916 sandwiched between a bottom electrode pick-up 906b and an upper electrode pick-up 922b. The MIM capacitor 940 is formed within the IMD layer 910 between two interconnect metal layers.

A lower metal interconnection trench region 902a and a bottom electrode pick-up trench region 902b are disposed in the ILD layer 902 and are spaced apart from each other. A first diffusion barrier layer 904a is disposed in the lower metal interconnection trench region 902a to cover the lower metal interconnection trench region 902a and separate the lower metal interconnection 906a from being in contact with the ILD layer 902. A second diffusion barrier layer 904b is disposed in the bottom electrode pick-up trench region 902b to cover the bottom electrode pick-up trench region 902b and separate the bottom electrode pick-up 906b from being in contact with the ILD layer 902.

The IMD layer 910 covers the lower metal interconnection 906a, the bottom electrode pick-up 906b and the ILD layer 902. Instead of including dual damascene structures as FIG. 1, the IMD layer 910 includes a first via hole 910a forming a damascene structure penetrating through the MD layer 910 at the left side, where at least a portion of the logical interconnecting architecture 930 is contained. The IMD layer 910 further includes a second hole 910b forming a damascene structure penetrating through the IMD layer 910 at the right side where at least a portion of the MIM capacitor 940, i.e. the capacitance storage body 916, is contained. Side walls and bottoms of the first via hole 910a and the second via hole 910b may form a perpendicular angle or a non-perpendicular angle.

For the logical interconnecting architecture 930, a third diffusion barrier layer 920a covers inner surfaces of the first via hole 910a. The upper metal interconnection 922a fills the first via hole 910a, and the upper metal interconnection 922a is surrounded by the third diffusion barrier layer 920a. For the MIM capacitor 940, a bottom electrode layer 912b covers inner surfaces of the second via hole 910b. A capacitor dielectric layer 914b covers the bottom electrode layer 912b. A second metal layer 920b covers inner surfaces of the capacitor dielectric layer 914b. The upper electrode pick-up 922b fills the second via hole 910b and is surrounded by the second metal layer 920b. Capacitance storage capability of the capacitance storage body 916 may be determined in accordance with, for example, a dielectric constant, an area and a thickness of the capacitor dielectric layer 914b.

FIG. 9 is only for illustrative purposes and is not a limitation of the present disclosure. For example, there may be more than one MIM capacitor so formed by the illustrative process. The size and position of the lower metal interconnection 906a, the bottom electrode pick-up 906b, the upper metal interconnection 922a and the upper electrode pick-up 922b are for illustrative purposes and are not limiting. There may be more than one upper and lower metal interconnections in the logic part rather than one as shown. The size of each layer such as 900, 902 and 910 are only for illustrative purposes and is not limiting. The capacitance storage body 916 may be of different shapes such as cylindrical shape, or a concave shape.

According to the present disclosure, it is possible to reduce fabrication costs by reducing the number of required photolithography processes as compared to existing fabrication. Further, a required space for the disclosed MIM capacitor and the complexity of the MIM capacitor are both also reduced. As such, the disclosed MIM capacitor has a high capacitance density and may be disposed in any layer rather than being contained in the top two metal layers. The resulting MIM capacitors do not change any film scheme of CMOS logic process and therefore have no spice model shift, chip performance degradation and process reliability issues.

One embodiment of the present disclosure provides a semiconductor device. The semiconductor device includes: a semiconductor substrate; a first dielectric layer over the semiconductor substrate; a second dielectric layer over the first dielectric layer; an opening extending through the second dielectric layer; a bottom conductive layer conformably formed at a bottom and along side walls of the opening; a third dielectric layer conformably formed over the bottom conductive layer; an upper conductive layer conformably formed over the third dielectric layer; and an upper contact formed over and coupled to the upper conductive layer and filling the opening; wherein the upper conductive layer provide a barrier to diffusion of the upper contact to the third dielectric layer.

One embodiment of the present disclosure provides a metal-insulator-metal (MIM) capacitor. The MIM capacitor includes: a first dielectric layer; a bottom electrode pick-up formed in the first dielectric layer; a second dielectric layer over the first dielectric layer; a damascene aperture extending through the second dielectric layer; a bottom electrode layer conformably at a bottom and along side walls of the damascene aperture and coupled to the bottom electrode pick-up; a third dielectric layer conformably formed over the bottom electrode layer; an upper electrode layer conformably formed over the third dielectric layer; and an upper electrode pick-up formed over and coupled to the upper electrode layer and filling the damascene aperture; wherein the upper electrode layer provide a barrier to diffusion of the upper electrode pick-up to the third dielectric layer; and the bottom electrode layer provide a barrier to diffusion of the bottom electrode pick-up to the third dielectric layer.

One embodiment of the present disclosure provides a semiconductor manufacturing method. The method includes: providing a semiconductor substrate; forming a first dielectric layer over the semiconductor substrate; forming a second dielectric layer over the first dielectric layer; forming an opening extending through the second dielectric layer; forming a bottom conductive layer conformably at a bottom and along side walls of the opening; forming a third dielectric layer conformably over the bottom conductive layer; forming an upper conductive layer conformably over the third dielectric layer; and forming an upper contact over the upper conductive layer to fill the opening; wherein the upper conductive layer provide a barrier to diffusion of the upper contact to the third dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a semiconductor substrate;
a first dielectric layer over the semiconductor substrate;
a second dielectric layer over the first dielectric layer;
a via extending through the second dielectric layer;
a bottom conductive layer conformably formed at a bottom and along side walls of the via;
a third dielectric layer conformably formed over the bottom conductive layer;
an upper conductive layer conformably formed over the third dielectric layer; and
an upper contact formed over and coupled to the upper conductive layer and filling the via;
wherein the upper conductive layer provides a diffusion barrier between the upper contact and the third dielectric layer.

2. The device of claim 1, further comprising a bottom contact in the first dielectric layer, wherein the bottom contact is coupled to the bottom conductive layer.

3. The device of claim 2, wherein the bottom conductive layer, the third dielectric layer and the upper conductive layer commonly form a capacitance storage body.

4. The device of claim 2, wherein the bottom conductive layer provides a diffusion barrier between the bottom contact and the third dielectric layer.

5. The device of claim 1, wherein the via includes a step configuration.

6. The device of claim 1, wherein the third dielectric layer includes high dielectric constant (high-k) materials with k value ranging from 20 to 500.

7. The device of claim 1, wherein the second dielectric layer includes undoped silicate glass (USG).

8. The device of claim 1, wherein the bottom conductive layer includes tantalum nitride (TaN).

9. The device of claim 1, further comprising a second bottom conductive layer between the bottom conductive layer and the third dielectric layer, wherein the second bottom conductive layer has a higher conductivity than the bottom conductive layer.

10. The device of claim 1, wherein the upper conductive layer includes tantalum nitride (TaN).

11. The device of claim 1, further comprising a second upper conductive layer between the upper conductive layer and the third dielectric layer, wherein the second upper conductive layer has a higher conductivity than the upper conductive layer.

12. The device of claim 1, wherein the upper contact includes copper (Cu).

13. A semiconductor manufacturing method, comprising:
providing a semiconductor substrate;
forming a first dielectric layer over the semiconductor substrate;
forming a second dielectric layer over the first dielectric layer;
forming an via extending through the second dielectric layer;
forming a bottom conductive layer conformably at a bottom and along side walls of the via;
forming a third dielectric layer conformably over the bottom conductive layer;
forming an upper conductive layer conformably over the third dielectric layer; and
forming an upper contact over the upper conductive layer to fill the via;
wherein the upper conductive layer provides a diffusion barrier between the upper contact and the third dielectric layer.

* * * * *